United States Patent
Wang et al.

(10) Patent No.: US 11,127,480 B1
(45) Date of Patent: Sep. 21, 2021

(54) SYSTEM AND METHOD FOR SHORT CIRCUIT DETECTION

(71) Applicant: DELL PRODUCTS, LP, Round Rock, TX (US)

(72) Inventors: Isaac Q. Wang, Austin, TX (US); James Petivan, Austin, TX (US); Earl Boone, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/916,619

(22) Filed: Jun. 30, 2020

(51) Int. Cl.
*G11C 29/44* (2006.01)
*G11C 29/50* (2006.01)
*G11C 29/12* (2006.01)
*G01R 31/52* (2020.01)

(52) U.S. Cl.
CPC .............. *G11C 29/44* (2013.01); *G01R 31/52* (2020.01); *G11C 29/12005* (2013.01); *G11C 29/50004* (2013.01)

(58) Field of Classification Search
CPC .............. G11C 29/44; G11C 29/12005; G11C 29/50004; G01R 31/52
See application file for complete search history.

(56) References Cited

U.S. PATENT DOCUMENTS

| | | | |
|---|---|---|---|
| 6,246,559 B1 | 6/2001 | Sanders et al. | |
| 7,996,162 B1* | 8/2011 | Zhang | G01R 31/2853 |
| | | | 702/58 |
| 8,922,221 B2 | 12/2014 | Lacombe et al. | |
| 9,014,371 B2* | 4/2015 | Kim | G06F 21/72 |
| | | | 380/44 |
| 9,859,228 B2* | 1/2018 | Choi | G09C 1/00 |
| 9,975,502 B2* | 5/2018 | Mijac | B60R 16/023 |
| 10,134,691 B2* | 11/2018 | Choi | H01L 21/76877 |
| 10,408,875 B2* | 9/2019 | Chang | G01R 31/70 |
| 10,627,453 B2* | 4/2020 | Asakura | H01M 10/482 |
| 10,757,780 B2* | 8/2020 | Dixon | H02J 9/061 |
| 2021/0036525 A1* | 2/2021 | Kim | H02J 7/00036 |
| 2021/0066143 A1* | 3/2021 | Jung | H01L 22/32 |

\* cited by examiner

*Primary Examiner* — Tri M Hoang
(74) *Attorney, Agent, or Firm* — Larson Newman, LLP

(57) ABSTRACT

A method for identifying a short circuit at a circuit node may include activating a current source to drive a signal at the circuit node, and sampling a voltage level at the circuit node at a particular time. The method may further include determining that the circuit node is not shorted to another circuit node if the voltage level at the first circuit node exceeds a threshold value; and determining that the first circuit node is shorted to another circuit node if the voltage level at the first circuit node does not exceed the threshold value.

20 Claims, 6 Drawing Sheets

SYSTEM AND METHOD FOR SHORT CIRCUIT DETECTION

FIELD OF THE DISCLOSURE

This disclosure generally relates to information handling systems, and more particularly relates to short circuit detection.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A method for identifying a short circuit at a circuit node may include activating a current source to drive a signal at the circuit node, and sampling a voltage level at the circuit node at a particular time. The method may further include determining that the circuit node is not shorted to another circuit node if the voltage level at the first circuit node exceeds a threshold value; and determining that the first circuit node is shorted to another circuit node if the voltage level at the first circuit node does not exceed the threshold value.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
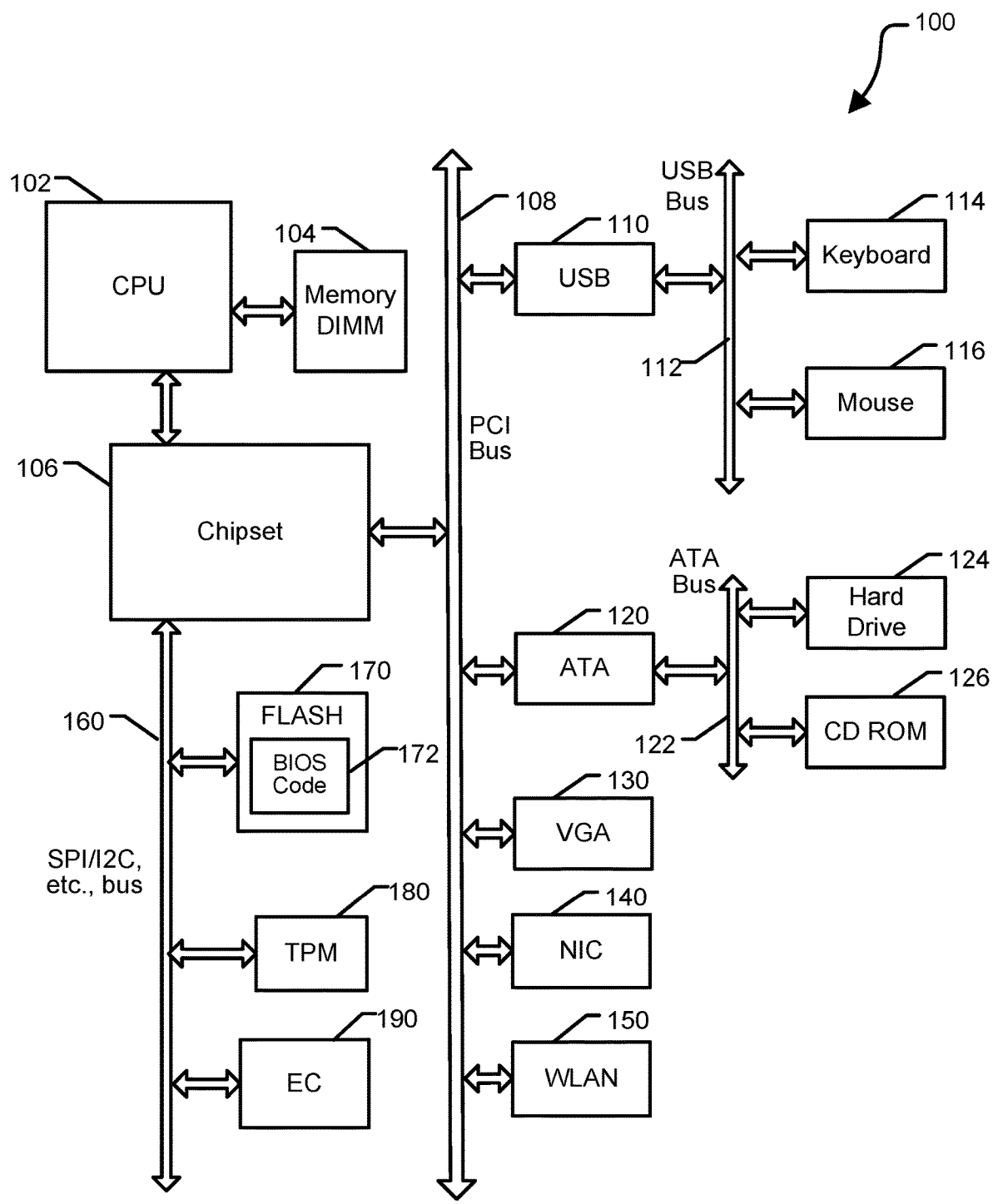
FIG. 1 is a block diagram of an information handling system according to a specific embodiment of the present disclosure.

FIG. 1 illustrates an information handling system 100 including a processor 102, a memory 104, a chipset 106, a Peripheral Component Interconnect (PCI) bus 108, a Universal Serial Bus (USB) controller 110, a USB 112, a keyboard device 114, a mouse device controller 116, an Advanced Technology Attachment (ATA) bus controller 120, an ATA bus 122, a data storage device 124, a compact disk read only memory (CD ROM) device 126, a video graphics array (VGA) device 130, a network interface controller (NIC) 140, a wireless local area network (WLAN) controller 150, one or more serial buses 160, a non-volatile random access memory (NVRAM) 170 for storing a basic input/output system (BIOS) 172, a Trusted Platform Module (TPM) 180, and an embedded controller (EC) 190.

NVRAM 170 can be referred to as a serial peripheral interface (SPI) flash storage device, BIOS SPI, and the like. TPM 180 is configured to ensure that the boot process starts from a trusted combination of hardware and software, and continues until the operating system has fully booted and applications are running. TPM 180 is compliant with an international standard for a secure cryptoprocessor, a dedicated microcontroller designed to secure hardware through integrated cryptographic keys. EC 190 can be referred to as a service processor, a baseboard management controller (BMC), and the like. EC 190 includes a processor that can operate out-of-band with respect to CPU 102. For example, remote management systems can utilize EC 190 to access components at information handling system independent of an operating state of CPU 102. EC 190 may be responsible for performing low level hardware tasks including thermal management and power management operations.

Information handling system 100 can include additional components and additional buses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and one or more components can be integrated together. For example, portions of chipset 106 can be integrated within CPU 102. In an embodiment, chipset 106 can include a platform controller hub (PCH). System 100 can include additional buses and bus protocols. Serial bus 160 is representative of one or more buses and/or bus protocols, such as a serial peripheral interface (SPI) bus, an inter-integrated circuit protocol (I2C) bus, a system management bus (SMB), a power management bus (PMBus), and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

BIOS 172 includes instructions executable by CPU 102 to initialize and test the hardware components of system 100, and to load a boot loader or an operating system (OS) from a mass storage device. BIOS 172 additionally provides an abstraction layer for the hardware, that is a consistent way for application programs and OS to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device. In an embodiment, BIOS 172 can provide one or more runtime processes or device drivers that are configured to support functionality disclosed herein. After the initialization procedure is complete and an operating system is loaded, such as Windows, computational operation of information handling system can begin. In an embodiment, the BIOS 172 can be substantially compliant with one or more revisions of the Unified Extensible Firmware Interface (UEFI) specification.

Memory 104 can include one or more dual inline memory modules (DIMMs), that utilize multiple dynamic random access integrated circuit memory devices mounted at a discrete printed circuit board (PCB). The DIMMs are typically installed at corresponding sockets provided at a main board of information handling system 100. In particular, the printed circuit board includes a large number of conductor traces, referred to herein as finger pins. Each finger pin is configured to mate with a corresponding conductor at the socket to provide signal paths between the main board circuitry and the memory devices at the DIMM. The finger pins are closely spaced to adjacent pins, such as one quarter of a millimeter separating each finger pin.

Occasionally, the finger pins can be misaligned relative to their corresponding socket conductors, resulting in a short circuit between adjacent pins. Such a short circuit is likely to cause operational failure of information handling system 100, and in some cases may result in damage to the DIMM or to circuitry included at the main board. For example, a particular DIMM specification known as DDR5 specifies that a power supply pin is adjacent to a pin configured to provide a power-good indicator to system 100. The power supply pin, VIN_BULK, can be energized at 12 volts (or 5 volts on some systems) during operation, while the power-good pin, PWR_GOOD, may operate at only 3.3 volts. In the event of a short circuit between these pins, circuitry associated with the PWR_GOOD pin can be damaged by the relatively high voltage present at the VIN_BULK pin.

Techniques disclosed herein can be used to identify a short circuit. In particular, the short circuit can be identified before primary power to memory 104 and other components at information handling system 100 is enabled. While these techniques are illustrated in the context of a DIMM, one of skill will appreciate that the techniques can be utilized to detect short circuits between other signal conductors. The disclosed techniques are especially suited for detecting short circuits between a signal node having relatively low capacitance and another node having a high capacitance relative to the signal node, such as a power supply node.

Figure 2:
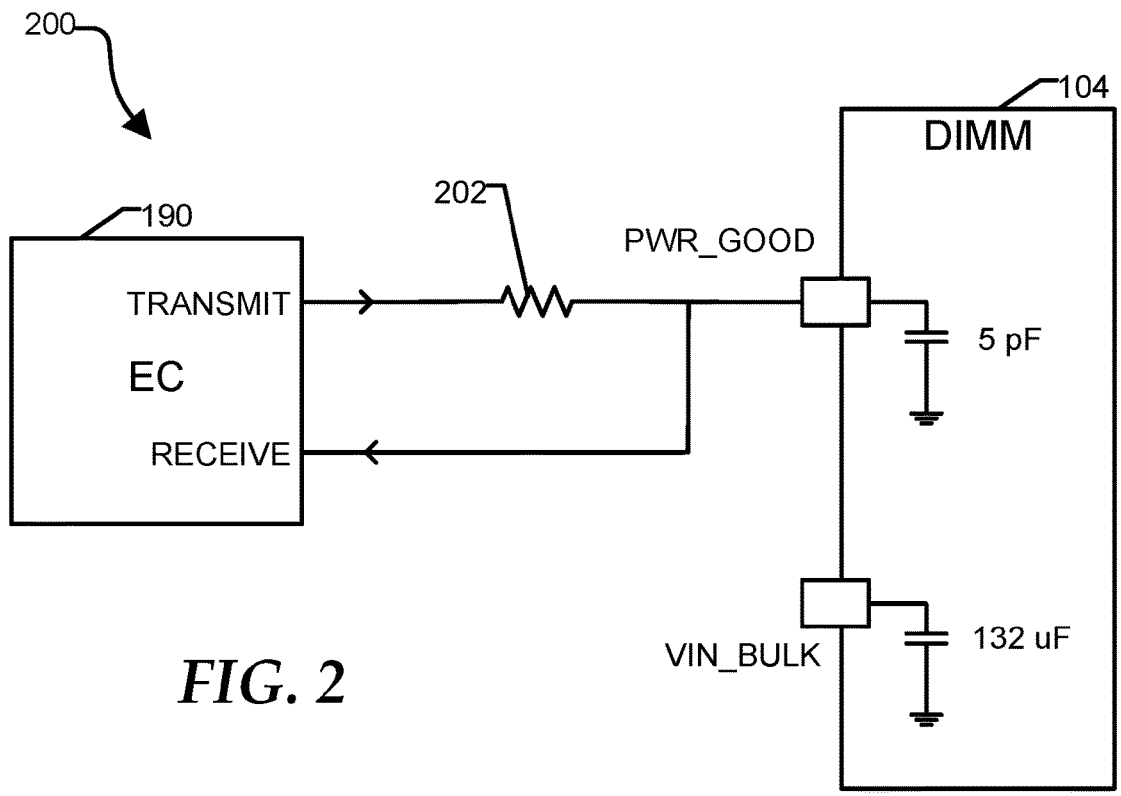
FIG. 2 is a block diagram illustrating a circuit at the information handling system of FIG. 1, according to a specific embodiment of the present disclosure.

FIG. 2 shows a circuit 200 of information handling system 100 of FIG. 1, according to a specific embodiment of the present disclosure. Circuit 200 includes EC 190 and DIMM 104. EC 190 includes an output, labeled TRANSMIT, that is electrically coupled to a PWR_GOOD pin of DIMM 104 via a resistor 202, and an input, labeled RECEIVE that is electrically connected to the PWR_GOOD pin. DIMM 104 also includes a power supply pin, VIN_BULK. EC 190 and DIMM 104 include a plurality of additional pins coupled to other components at information handling system 100, not shown for clarity. In a particular embodiment, a specified capacitance at pin PWR_GOOD is 5 pF, while a specified capacitance at pin VIN_BULK is 132 uF. In an embodiment, the techniques disclosed herein can be conducted while system 100 is operating in a power state known as Soft Off, or S5. While in the S5 state, primary power has yet to be provided to many system components, including CPU 102 and memory 104, however EC 190 is operational. On completion of a short circuit test, primary power can be enabled at system 100 if a short circuit is not detected, while primary power is not enabled if a short circuit is detected. One of skill will appreciate that other logic circuitry can be utilized, instead of or in combination with EC 190, to perform the short circuit test described herein.

Figure 3:
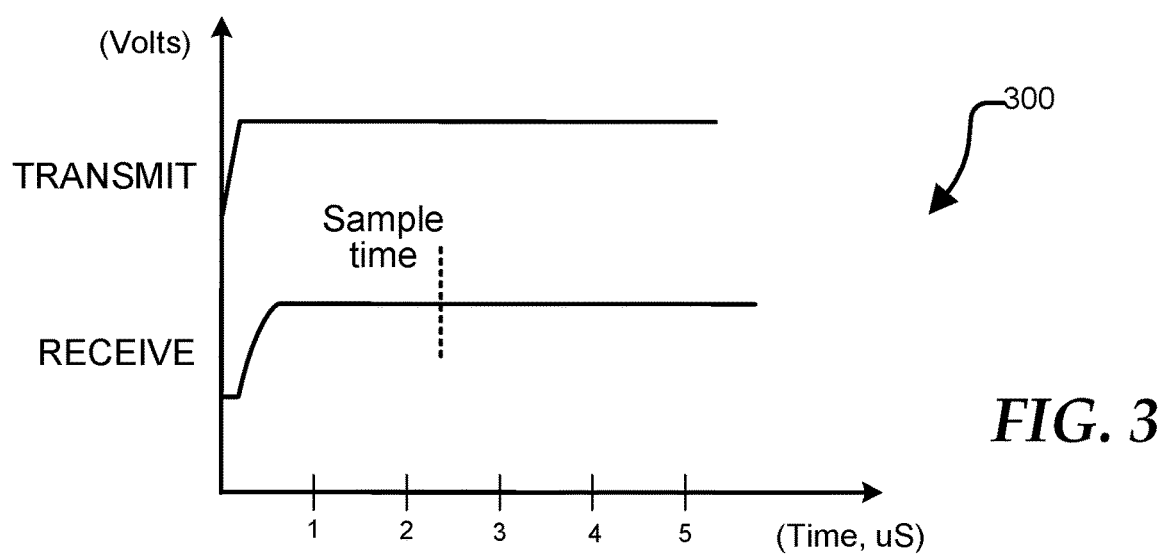
FIG. 3 is a timing diagram illustrating operation of the circuit at FIG. 2, according to a specific embodiment of the present disclosure.

FIG. 3 shows operation of circuit 200 according to a specific embodiment of the present disclosure. FIG. 3 includes a timing diagram 300 illustrating signals at output TRANSMIT and input RECEIVE of circuit 200. Timing diagram 300 includes a vertical axis representing voltage, and a horizontal axis representing time in microseconds. A short circuit test can begin by asserting a logic high level at output TRANSMIT, which together with resistor 202 implements a current source for charging the capacitance at pin PWR_GOOD. Based on the selected value of resistor 202 and the capacitance at pin PWR_GOOD, a voltage at node PWR_GOOD increases relatively quickly. EC 190 can sample a logic level at input RECEIVE at a predetermined time after activating output TRANSMIT. As shown at FIG. 3, a voltage level sampled at the sample time is at a logic high level. The predetermined time at which the sample is taken can be selected based on a first time constant corresponding to a non-shorted situation and a second time constant corresponding to a shorted situation. For example, the sampling may be configured to occur at a time that is greater than the first time constant and significantly less than the second time constant.

Figure 4:
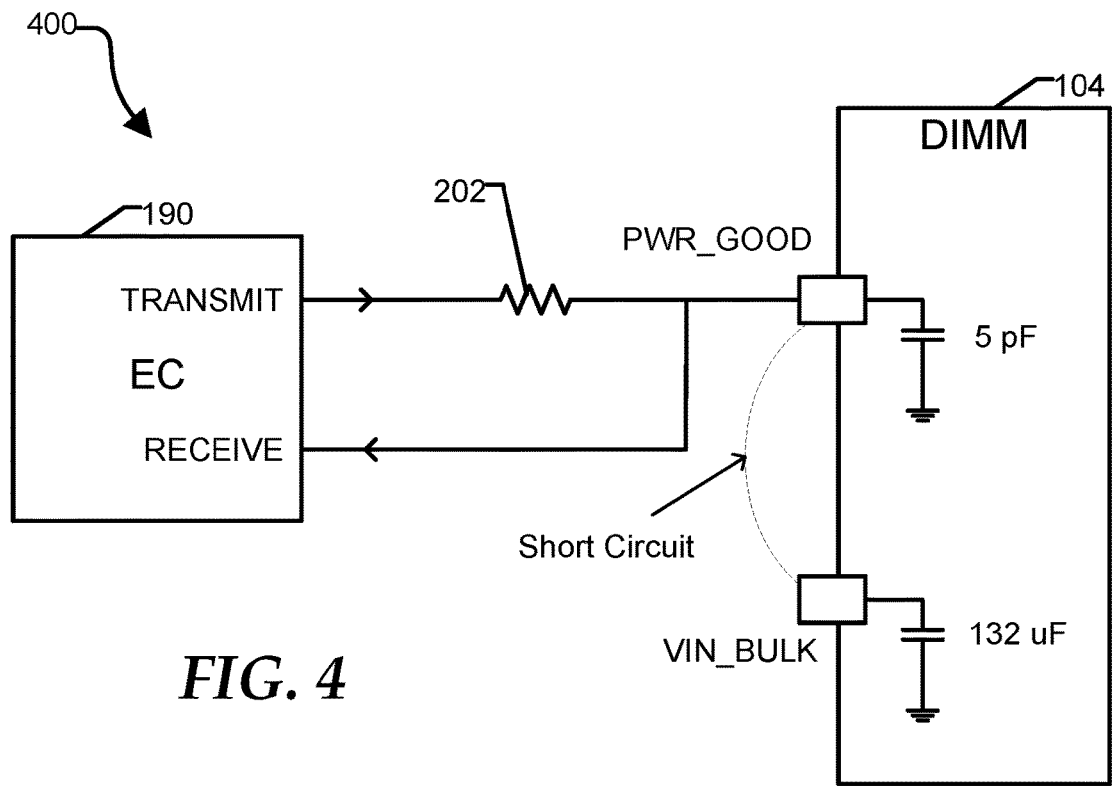
FIG. 4 is a block diagram illustrating a circuit at the information handling system of FIG. 1, according to another embodiment of the present disclosure.
Figure 5:
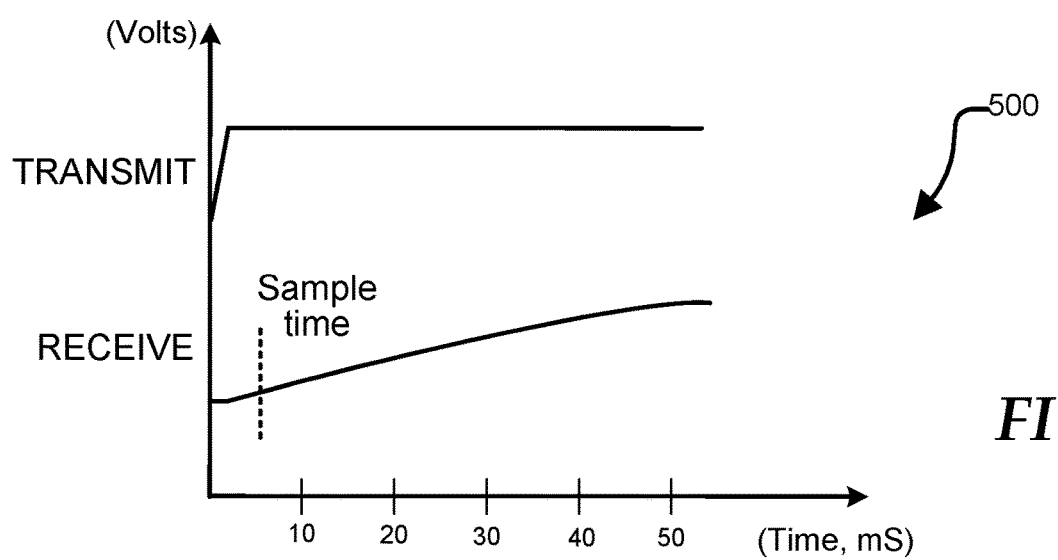
FIG. 5 is a timing diagram illustrating operation of the circuit at FIG. 4, according to a specific embodiment of the present disclosure.

FIG. 4 shows circuit 400 according to a specific embodiment of the present disclosure. Circuit 400 is the same as circuit 200 of FIG. 2 except that a short circuit exists between pin PWR_GOOD and pin VIN_BULK. FIG. 5 shows operation of circuit 400 according to a specific embodiment of the present disclosure. FIG. 5 is similar to FIG. 3, including a timing diagram 500 illustrating signals at output TRANSMIT and at input RECEIVE of circuit 400. Note that the horizontal axis of timing diagram 500 now represents milliseconds instead of microseconds. A short circuit test can begin by asserting a logic high level at output TRANSMIT, which together with resistor 202 implements a current source for charging the capacitance at pin PWR_GOOD. In the event of a short circuit between pins PWR_GOOD and pin VIN_BULK, the amount of time required to charge the capacitance at node PWR_GOOD combined with the capacitance at node VIN_BULK is significantly greater than the time to charge pin PWR_GOOD when not shorted. EC 190 can sample a logic level at input RECEIVE at the same predetermined time selected at FIG. 3. As shown at FIG. 5, a voltage level sampled at the sample time is at a logic low level, identifying a short circuit.

Figure 6:
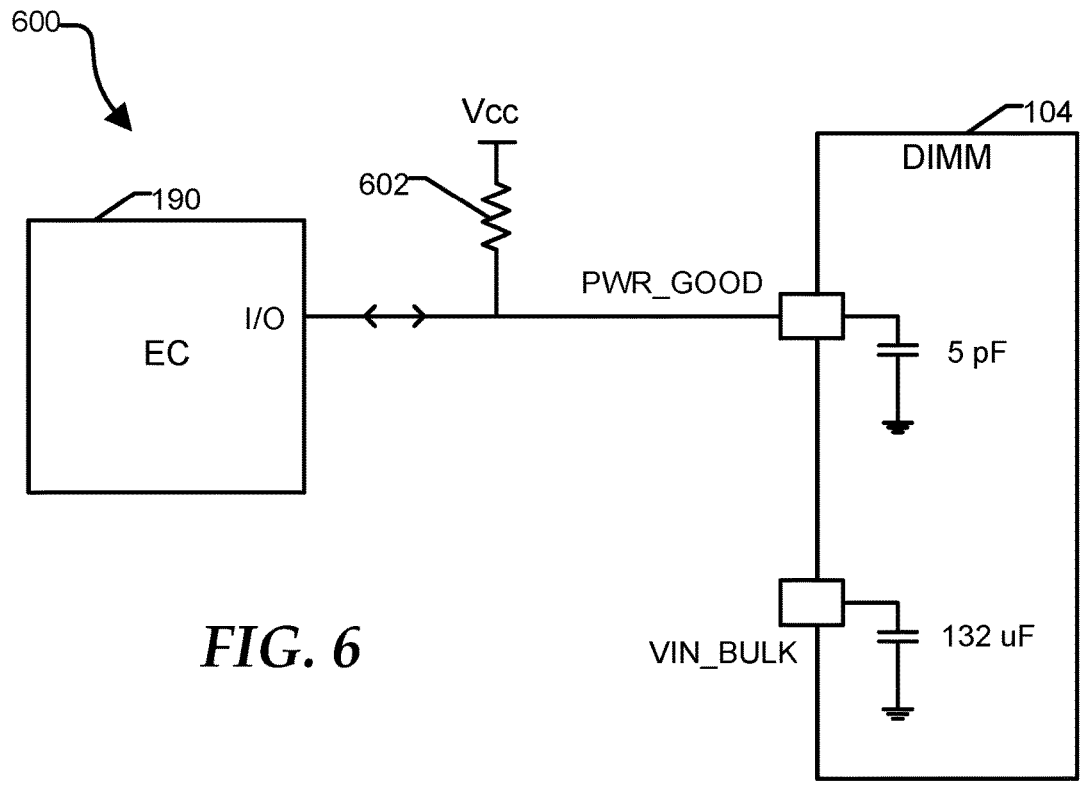
FIG. 6 is a block diagram illustrating a circuit at the information handling system of FIG. 1, according to yet another embodiment of the present disclosure.

FIG. 6 shows a circuit 600 of information handling system 100 of FIG. 1, according to another embodiment of the present disclosure. Circuit 600 includes EC 190 and DIMM 104. EC 190 includes an I/O terminal that is electrically coupled to a PWR_GOOD pin of DIMM 104. A resistor 602 provides a pull-up to a supply voltage Vcc, which may be the same supply voltage provided to EC 190, such as 3.3 volts. DIMM 104 includes a power supply pin, VIN_BULK. In a particular embodiment, a specified capacitance at pin PWR_GOOD is 5 pF, while a specified capacitance at pin VIN_BULK is 132 uF. As described above with reference to FIG. 2, the techniques disclosed herein can be conducted while system 100 is operating in an S5 state. On completion of a short circuit test, primary power can be enabled at system 100 if a short circuit is not detected, while primary power is not enabled if a short circuit is detected.

Figure 7:
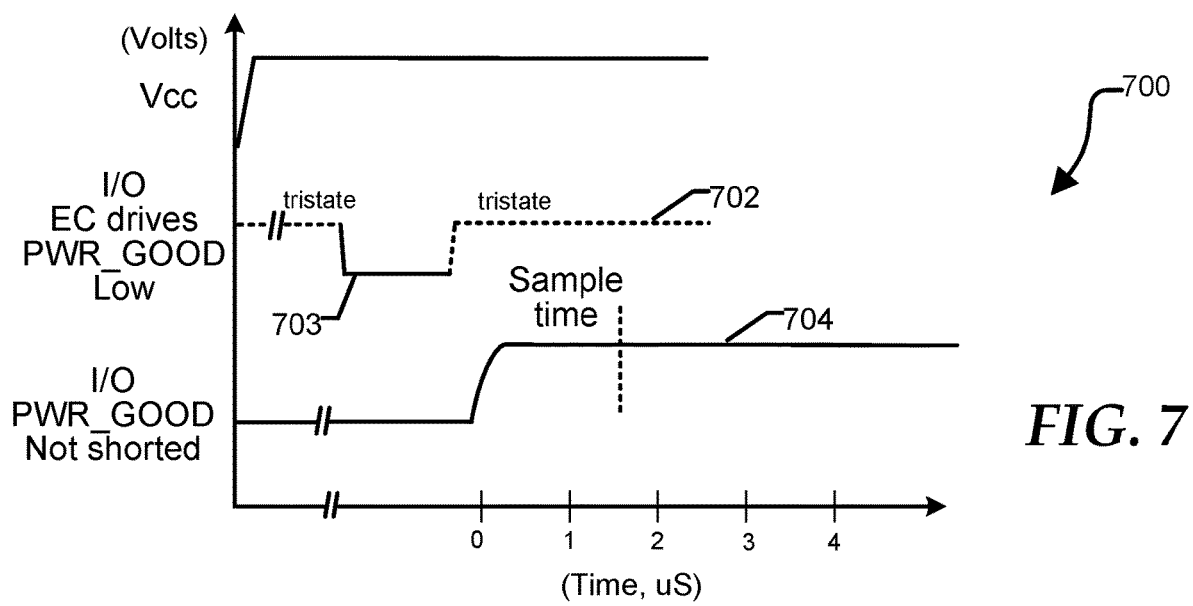
FIG. 7 is a timing diagram illustrating operation of the circuit at FIG. 6, according to a specific embodiment of the present disclosure.

FIG. 7 shows operation of circuit 600 according to a specific embodiment of the present disclosure. FIG. 7 includes a timing diagram 700 illustrating power supply signal Vcc and signal waveforms at node PWR_GOOD at circuit 600. In particular, timing diagram 700 includes a waveform 702 and waveform 704, both corresponding to node PWR_GOOD. A short circuit test begins by activating supply voltage Vcc, shown transitioning from a ground potential to an operating level, such as 3.3 volts. For example, when information handling system 100 is initially plugged in, EC 190 receives power and begins executing instructions, transitioning system 100 to a S5 power state. The I/O terminal of EC 190 is initially tri-stated so as not to drive node PWR_GOOD, as illustrated at waveform 702. After a period of time to allow EC 190 to begin operation, EC 190 is configured to drive node PWR_GOOD to a logic low value in order to discharge node PWR_GOOD, returning the node to a ground voltage level if not already at that level, as indicated by reference 703. After a period of time, EC discontinues driving the low level and returns to a tri-state configuration. Waveform 704 shows how the current source implemented by supply voltage Vcc and resistor 602 charges node PWR_GOOD. As described above with reference to FIG. 3, a logic level is sampled at node PWR_GOOD at a predetermined sample time after EC discontinued driving the node low. Because no short circuit exists, the relatively low capacitance at node PWR_GOOD is charged substantially quickly. Accordingly, the voltage level sampled at the PWR_GOOD pin will correspond to a logic high value, indicating that node PWR_GOOD is not shorted to another node, such as node VIN BILK.

Figure 8:
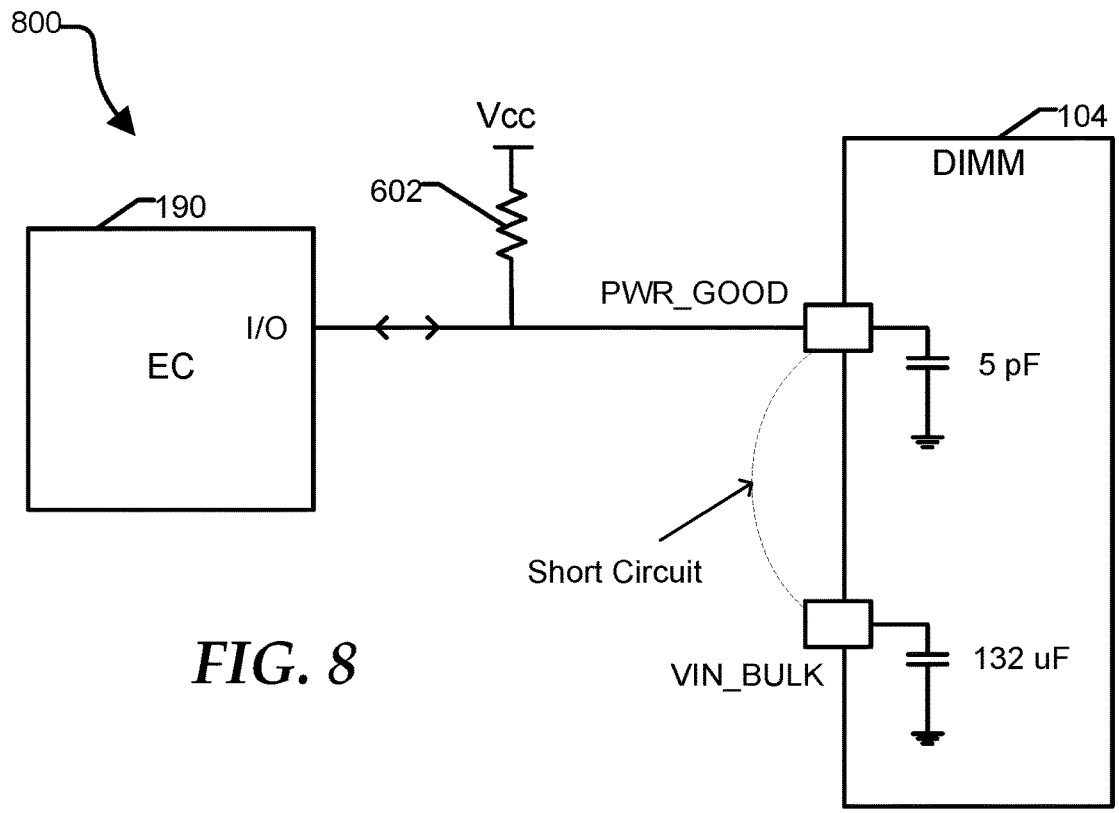
FIG. 8 is a block diagram illustrating a circuit at the information handling system of FIG. 1, according to still another embodiment of the present disclosure.
Figure 9:
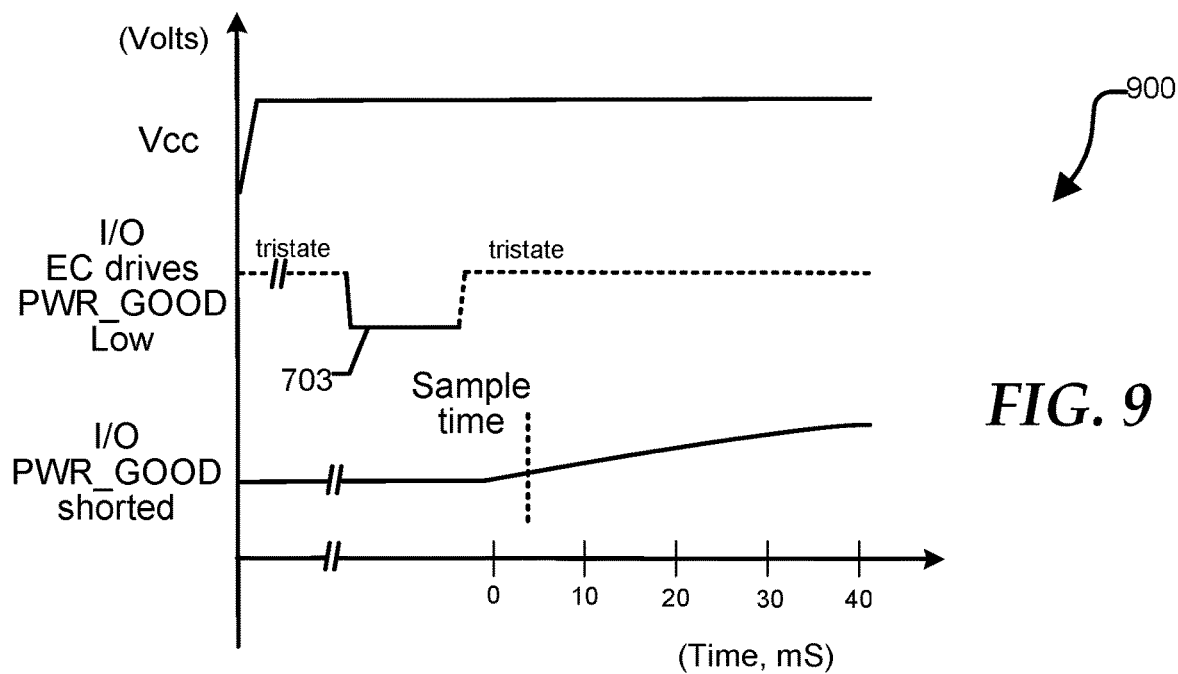
FIG. 9 is a timing diagram illustrating operation of the circuit at FIG. 8, according to a specific embodiment of the present disclosure.

FIG. 8 shows circuit 800 according to a specific embodiment of the present disclosure. Circuit 800 is the same as circuit 600 of FIG. 6 except that a short circuit exists between pin PWR_GOOD and pin VIN_BULK. FIG. 9 shows operation of circuit 800 according to a specific embodiment of the present disclosure. FIG. 9 shows a timing diagram that is similar to that of FIG. 7. Operation of circuit 800 is the same as described above with reference to FIGS. 6 and 7, except that the time required to charge the capacitance at node PWR_GOOD when shorted to node VIN_BULK is substantially greater than the time required to charge only the capacitance of node PWR_GOOD. Accordingly, if a logic level at node PWR_GOOD is sampled at the same time as shown at FIG. 7, a logic low level is received at EC 190, indicating that node PWR_GOOD is shorted to another node, such as node VIN_BULK.

Figure 10:
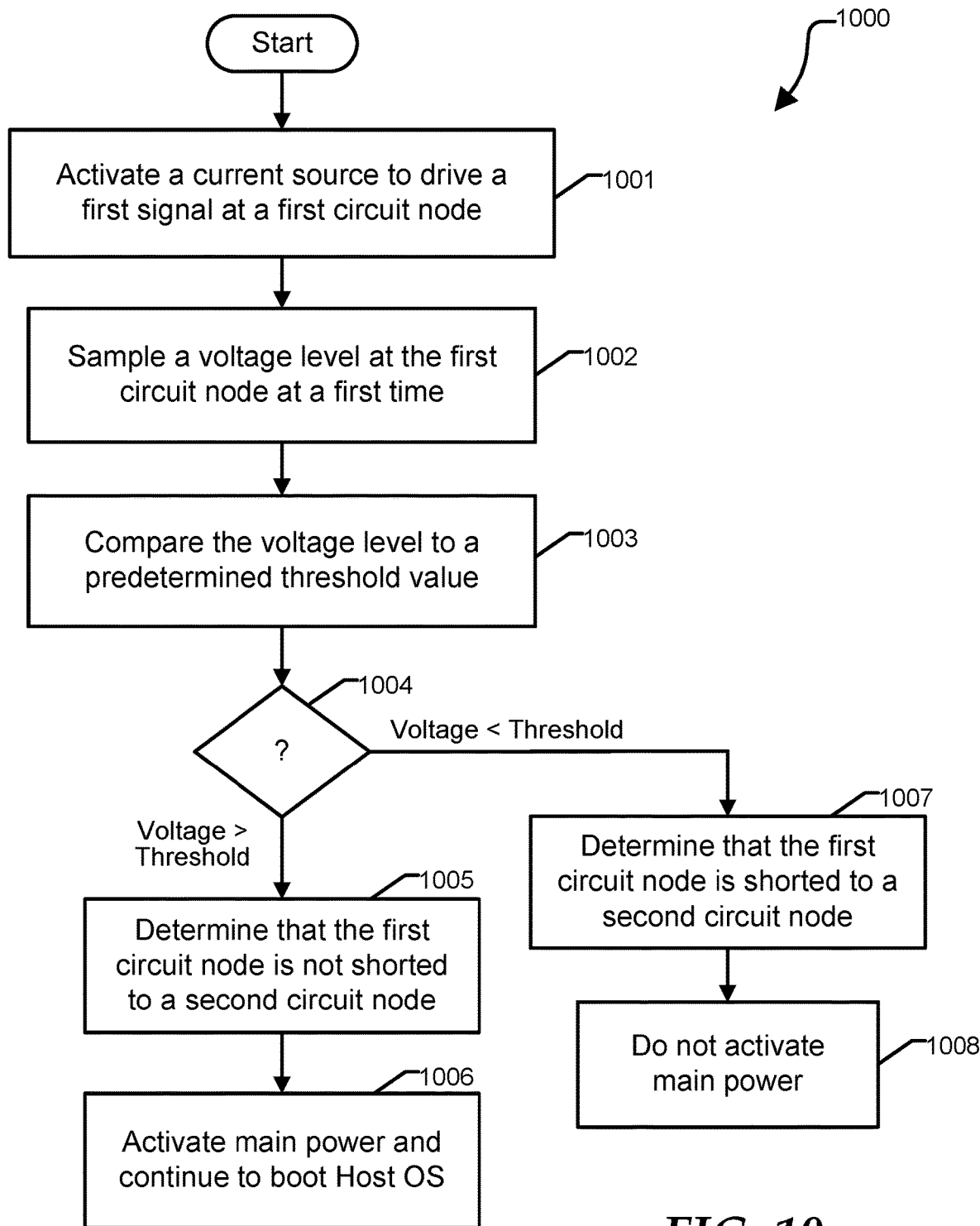
FIG. 10 is a flow diagram illustrating a method for identifying a short circuit at a circuit node, according to a specific embodiment of the present disclosure.

FIG. 10 shows a method 1000 for detecting a short circuit at a circuit pin according to a specific embodiment of the present disclosure. Method 1000 begins at block 1001 where a current source is activated to drive a first signal at a first circuit node. For example, EC 190 can assert a logic-high signal at output TRANSMIT, which charges node PWR_GOOD via resistor 202, as shown at FIG. 2. Similarly, the capacitance at node PWR_GOOD can be charged by a current source provided by pullup resistor 602, as shown at FIG. 6. Method 1000 continues at block 1002 where a voltage level is sampled at the first node at a first time. For example, EC 190 can determine a logic level of node PWR_GOOD at input RECEIVE as shown at FIG. 3, or at the input/output terminal as shown at FIG. 7. At block 1003, the voltage level at the first circuit node is compared to a predetermined threshold voltage. For example, EC 190 can sample a logic level at node PWR_GOOD, the threshold voltage being a typical CMOS switching voltage, approximately fifty percent of the power supply voltage at EC 190. Alternatively, EC 190 can include an analog to digital converter to measure the voltage at node PWR_GOOD. In still another embodiment, EC 190 can include an analog comparator configured to identify if the voltage at node PWR_GOOD is less than or greater than an internal threshold voltage. If the voltage at the first node is greater than the threshold voltage, method 1000 proceeds to block 1005, whereas if the voltage at the first node is less than the threshold voltage, method 1000 proceeds to block 1007.

If the voltage at the first node is greater than the threshold voltage, EC 190 can determine that the first circuit node is not shorted to a second circuit node, as shown at block 1005. For example, the current source at block 1001 is able to substantially fully charge the relatively small capacitance associated with the PWR_GOOD pin of DIMM 104 by the time that the voltage is sampled. Method 1000 completes at block 1006 where main power can be activated at information handling system 100, and a host OS can be initialized. Returning to block 1007, if however the voltage at the first node is less than the threshold voltage, EC 190 can determine that the first circuit node is shorted to another circuit node. For example, the current source at block 1001 is unable to substantially charge the relatively large capacitance associated with the combination of the PWR_GOOD pin and the VIN_BULK pin of DIMM 104 by the time that the voltage is sampled. Method 1000 completes at block 1008 where main power is not activated at system 100. In an embodiment, EC 190 can set a flag identifying the short circuit determination or otherwise notify a system administrator of the situation via a network interface at EC 190.

In another embodiment, EC 190 can identify a short circuit between the PWR_GOOD pin and the VIN_BULK pin by driving a signal at node VIN_BULK while monitoring a voltage level at node PWR_GOOD. For example, a static pullup resistor can be provided at node PWR_GOOD to gently maintain a logic high value at node PWR_GOOD. EC 190 can conditionally discharge Node VIN_BULK by activating a transistor coupling the VIN_BULK node to a ground reference voltage. If a short circuit exists between the PWR_GOOD pin and the VIN_BULK pin, node PWR_GOOD will be discharged to a ground level. If there is no short circuit between the PWR_GOOD pin and the VIN_BULK pin, a voltage at the PWR_GOOD node will remain at a logic high level.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An apparatus comprising:
   a first circuit node;
   a current source to drive a first signal at the first circuit node; and
   a logic device to:
   sample a voltage level at the first circuit node at a first time;
   determine that the first circuit node is not shorted to a second circuit node if the voltage level at the first circuit node exceeds a first threshold value; and
   determine that the first circuit node is shorted to the second circuit node if the voltage level at the first circuit node does not exceed the first threshold value.

2. The apparatus of claim 1, wherein the logic device is further to activate primary power at an information handling system in response to determining that the first circuit node is not shorted to the second circuit node, and to suppress activation of the primary power in response to determining that the first circuit node is shorted to the second circuit node.

3. The apparatus of claim 1, wherein the first circuit node corresponds to a first pin at a memory module, and the second circuit node corresponds to a second pin at the memory module.

4. The apparatus of claim 3, wherein the first circuit node corresponds to a PWR_GOOD output at the memory module, and the second circuit node corresponds to a VIN_BULK input at the memory module.

5. The apparatus of claim 3, wherein the short circuit is caused by misalignment of the memory module at a socket.

6. The apparatus of claim 1, wherein the first circuit node corresponds to a digital signal output at an integrated circuit, and the second circuit node corresponds to a power input at the integrated circuit.

7. The apparatus of claim 1, where in a capacitance at the second circuit node is at least ten times a capacitance of the first circuit node.

8. The apparatus of claim 1, wherein the logic device comprises an embedded controller at an information handling system, the embedded controller configured to control power delivery to a central processing unit at the information handling system.

9. The apparatus of claim 1, wherein the current source is provided by the logic device.

10. The apparatus of claim 1, wherein the current source is provided by a passive pull-up resistor.

11. A method comprising:
    activating a current source to drive a first signal at a first circuit node;
    sampling a voltage level at the first circuit node at a first time;
    determining that the first circuit node is not shorted to a second circuit node if the voltage level at the first circuit node exceeds a first threshold value; and
    determining that the first circuit node is shorted to the second circuit node if the voltage level at the first circuit node does not exceed the first threshold value.

12. The method of claim 11, further comprising:
    activating primary power at an information handling system in response to determining that the first circuit node is not shorted to the second circuit node; and
    suppressing activation of the primary power in response to determining that the first circuit node is shorted to the second circuit node.

13. The method of claim 11, wherein the determining is performed by an embedded controller at an information handling system, the embedded controller configured to control power delivery to a central processing unit at the information handling system.

14. The method of claim 11, wherein the first circuit node corresponds to a first pin at a memory device, and the second circuit node corresponds to a second pin at the memory device.

15. The apparatus of claim 14, wherein the first circuit node corresponds to a PWR_GOOD output at the memory device, and the second circuit node corresponds to a VIN_BULK input at the memory device.

16. The method of claim 11, wherein the first circuit node corresponds to a digital signal output at an integrated circuit, and the second circuit node corresponds to a power input at the integrated circuit.

17. An information handling system comprising:
    a memory module inserted into a socket, the memory module including a first circuit node corresponding to a first socket conductor and a second circuit node corresponding to a second socket conductor; and
    an embedded controller to:
    activate a current source to drive a first signal at the first circuit node;
    sample a voltage level at the first circuit node at a first time;
    determine that the first circuit node is not shorted to the second circuit node if the voltage level at the first circuit node exceeds a first threshold value; and
    determine that the first circuit node is shorted to the second circuit node if the voltage level at the first circuit node does not exceed the first threshold value.

18. The information handling system of claim 17, wherein the embedded controller is further to activate primary power at the information handling system in response to determining that the first circuit node is not shorted to the second circuit node, and to suppress activation of the primary power in response to determining that the first circuit node is shorted to the second circuit node.

19. The information handling system of claim 17, wherein the first circuit node corresponds to a PWR_GOOD output at the memory module, and the second circuit node corresponds to a VIN_BULK input at the memory module.

20. The information handling system of claim 19, wherein the short circuit is caused by misalignment of the memory module at the socket.

* * * * *